(12) United States Patent
Shimizu et al.

(10) Patent No.: US 7,835,245 B2
(45) Date of Patent: Nov. 16, 2010

(54) EVALUATION VALUE CALCULATING APPARATUS, RECORDING AND PLAYBACK APPARATUS, EVALUATION VALUE CALCULATING METHOD, RECORDING METHOD

(75) Inventors: Toshiki Shimizu, Tokyo (JP); Jumpei Kura, Kanagawa (JP); Mariko Fukuyama, Tokyo (JP)

(73) Assignee: Sony Corporation, Tokyo (JP)

( * ) Notice: Subject to any disclaimer, the term of this patent is extended or adjusted under 35 U.S.C. 154(b) by 789 days.

(21) Appl. No.: 11/592,482

(22) Filed: Nov. 3, 2006

(65) Prior Publication Data
US 2007/0109939 A1 May 17, 2007

(30) Foreign Application Priority Data
Nov. 7, 2005 (JP) ............................ 2005-322159

(51) Int. Cl.
*G11B 20/10* (2006.01)
(52) U.S. Cl. ...................... 369/59.22; 360/31; 714/746; 714/794; 714/796
(58) Field of Classification Search ................... 360/31; 714/746, 794, 796; 369/59.22
See application file for complete search history.

(56) References Cited
U.S. PATENT DOCUMENTS

| | | | | |
|---|---|---|---|---|
| 5,938,791 A | * | 8/1999 | Narahara | .................... 714/795 |
| 6,982,942 B2 | * | 1/2006 | Uchida et al. | ............. 369/59.22 |
| 7,038,869 B2 | * | 5/2006 | Miyashita et al. | .............. 360/31 |
| 7,257,066 B2 | * | 8/2007 | Fujiwara et al. | .......... 369/53.15 |
| 2003/0043939 A1 | * | 3/2003 | Okumura et al. | ............. 375/341 |

FOREIGN PATENT DOCUMENTS

JP 2005-346897 12/2005

* cited by examiner

*Primary Examiner*—Wayne R Young
*Assistant Examiner*—Linh T Nguyen
(74) *Attorney, Agent, or Firm*—Frommer Lawrence & Haug LLP; William S. Frommer; Thomas F. Presson

(57) ABSTRACT

An evaluation value calculating apparatus includes the following elements. A difference metric selecting unit selects a difference metric for a specific recorded sequence in recorded sequences obtained in a maximum likelihood decoding process when information expressed with marks and spaces on a recording medium is played back, the difference metric being obtained in the maximum likelihood decoding process. A difference metric error value calculating unit determines a difference metric error value for the selected difference metric using a calculation method that is selected according to an edge shift direction of each of the marks on a time axis, the difference metric error value representing an error from an ideal difference metric and the edge shift direction on the time axis. A statistical processing unit performs statistical processing on the determined difference metric error value on the basis of each of states of path meeting points to generate an evaluation value.

9 Claims, 18 Drawing Sheets

| STATE | RECORDED BIT | |
|---|---|---|
| $s_k$ | $b_{k-1}$ | $b_k$ |
| S0 | 0 | 0 |
| S1 | 0 | 1 |
| S2 | 1 | 1 |
| S3 | 1 | 0 |

FIG. 4

| BRANCH | RECORDED BIT | | | STATE | | NOISELESS OUTPUT | BRANCH METRIC | |
|---|---|---|---|---|---|---|---|---|
| | $b_{k-2}$ | $b_{k-1}$ | $b_k$ | $s_{k-1}$ | $s_k$ | $y_k$ | $(z_k - y_k)^2$ | |
| a | 0 | 0 | 0 | S0 | S0 | $-A-B$ | $(z_k+A+B)^2$ | $bma_k$ |
| b | 1 | 0 | 0 | S3 | S0 | $-A$ | $(z_k+A)^2$ | $bmb_k$ |
| c | 0 | 0 | 1 | S0 | S1 | $-A$ | $(z_k+A)^2$ | $bmc_k$ |
| d | 0 | 1 | 1 | S1 | S2 | $A$ | $(z_k-A)^2$ | $bmd_k$ |
| e | 1 | 1 | 1 | S2 | S2 | $A+B$ | $(z_k-A-B)^2$ | $bme_k$ |
| f | 1 | 1 | 0 | S2 | S3 | $A$ | $(z_k-A)^2$ | $bmf_k$ |

FIG. 5

| STATE | ADD BRANCH METRIC AND COMPARE | SELECTED BRANCH | SELECTED METRIC | | DECODED BIT $b_{k-1}$ |
|---|---|---|---|---|---|
| $S0_k$ | $(m0_{k-1}+bma_k) \leq (m3_{k-1}+bmb_k)$ | a | $m0_k$ | $m0_{k-1}+bma_k$ | 0 |
|  | $(m0_{k-1}+bma_k) > (m3_{k-1}+bmb_k)$ | b |  | $m3_{k-1}+bmb_k$ | 0 |
| $S1_k$ | $m0_{k-1}+bmc_k$ | c | $m1_k$ | $m0_{k-1}+bmc_k$ | 1 |
| $S2_k$ | $(m1_{k-1}+bmd_k) \leq (m2_{k-1}+bme_k)$ | d | $m2_k$ | $m1_{k-1}+bmd_k$ | 1 |
|  | $(m1_{k-1}+bmd_k) > (m2_{k-1}+bme_k)$ | e |  | $m2_{k-1}+bme_k$ | 1 |
| $S3_k$ | $m2_{k-1}+bmf_k$ | f | $m3_k$ | $m2_{k-1}+bmf_k$ | 0 |

FIG. 6

| STATE | DIFFERENCE METRIC $\Delta m_k$ | SELECTED BRANCH | SELECTED METRIC | | DECODED BIT $b_k$ |
|---|---|---|---|---|---|
| $S0_k$ | $m3_{k-1}+bmb_k-m0_{k-1}-bma_k$ | a | $m0_k$ | $m0_{k-1}+bma_k$ | 0 |
|  | $m0_{k-1}+bma_k-m3_{k-1}-bmb_k$ | b |  | $m3_{k-1}+bmb_k$ | 0 |
| $S1_k$ | *** | c | $m1_k$ | $m0_{k-1}+bmc_k$ | 1 |
| $S2_k$ | $m2_{k-1}+bme_k-m1_{k-1}-bmd_k$ | d | $m2_k$ | $m1_{k-1}+bmd_k$ | 1 |
|  | $m1_{k-1}+bmd_k-m2_{k-1}-bme_k$ | e |  | $m2_{k-1}+bme_k$ | 1 |
| $S3_k$ | *** | f | $m3_k$ | $m2_{k-1}+bmf_k$ | 0 |

FIG. 9

| RECORDED PATH | STATE | | | | CRITICAL PATH |
|---|---|---|---|---|---|
| | $S_{k-3}$ | $S_{k-2}$ | $S_{k-1}$ | $S_k$ | |
| PathA | S0 | S0 | S1 | S2 | PathB |
| PathB | S0 | S1 | S2 | S2 | PathA |
| PathC | S2 | S2 | S3 | S0 | PathD |
| PathD | S2 | S3 | S0 | S0 | PathC |

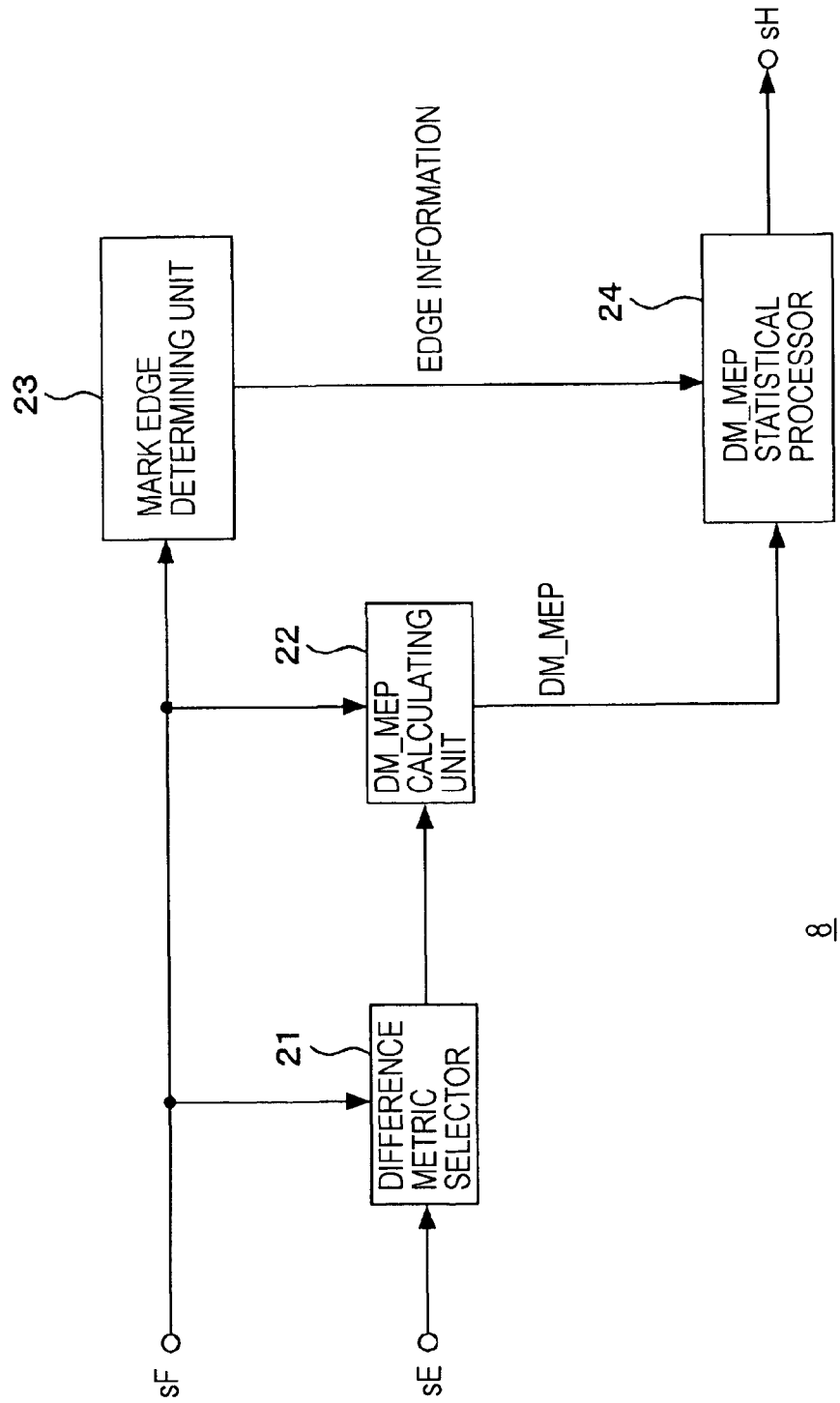

FIG. 12A

| sH | sH1 | MEAN VALUE OF SUM OF DM_MEP$_{FRONT}$ |
|---|---|---|
|  | sH2 | MEAN VALUE OF SUM OF DM_MEP$_{REAR}$ |

FIG. 12B

| sH | sH1-1 | MEAN VALUE OF SUM OF DM_MEP$_{FRONT}$ | IN CASE OF 2T SPACE BEFORE EDGE AND 3T MARK AFTER EDGE |
|---|---|---|---|
|  | sH1-2 |  | IN CASE OF 2T SPACE BEFORE EDGE AND 4T MARK AFTER EDGE |
|  | sH1-3 |  | IN CASE OF 2T SPACE BEFORE EDGE AND 5T-OR-MORE MARK AFTER EDGE |
|  | sH1-4 |  | IN CASE OF 3T SPACE BEFORE EDGE AND 2T MARK AFTER EDGE |
|  | sH1-5 |  | IN CASE OF 3T SPACE BEFORE EDGE AND 3T MARK AFTER EDGE |
|  | sH1-6 |  | IN CASE OF 3T SPACE BEFORE EDGE AND 4T MARK AFTER EDGE |
|  | sH1-7 |  | IN CASE OF 3T SPACE BEFORE EDGE AND 5T-OR-MORE MARK AFTER EDGE |
|  | sH1-8 |  | IN CASE OF 4T SPACE BEFORE EDGE AND 2T MARK AFTER EDGE |
|  | sH1-9 |  | IN CASE OF 4T SPACE BEFORE EDGE AND 3T MARK AFTER EDGE |
|  | sH1-10 |  | IN CASE OF 4T SPACE BEFORE EDGE AND 4T MARK AFTER EDGE |
|  | sH1-11 |  | IN CASE OF 4T SPACE BEFORE EDGE AND 5T-OR-MORE MARK AFTER EDGE |
|  | sH1-12 |  | IN CASE OF 5T-OR-MORE SPACE BEFORE EDGE AND 2T MARK AFTER EDGE |
|  | sH1-13 |  | IN CASE OF 5T-OR-MORE SPACE BEFORE EDGE AND 3T MARK AFTER EDGE |
|  | sH1-14 |  | IN CASE OF 5T-OR-MORE SPACE BEFORE EDGE AND 4T MARK AFTER EDGE |
|  | sH1-15 |  | IN CASE OF 5T-OR-MORE SPACE BEFORE EDGE AND 5T-OR-MORE MARK AFTER EDGE |
|  | sH2-1 | MEAN VALUE OF SUM OF DM_MEP$_{REAR}$ | IN CASE OF 2T SPACE BEFORE EDGE AND 3T MARK AFTER EDGE |
|  | sH2-2 |  | IN CASE OF 2T SPACE BEFORE EDGE AND 4T MARK AFTER EDGE |
|  | ⋮ |  | ⋮ |
|  | sH2-15 |  | IN CASE OF 5T-OR-MORE SPACE BEFORE EDGE AND 5T-OR-MORE MARK AFTER EDGE |

EVALUATION VALUE CALCULATING APPARATUS, RECORDING AND PLAYBACK APPARATUS, EVALUATION VALUE CALCULATING METHOD, RECORDING METHOD

CROSS REFERENCES TO RELATED APPLICATIONS

The present invention contains subject matter related to Japanese Patent Application JP 2005-322159 filed in the Japanese Patent Office on Nov. 7, 2005, the entire contents of which are incorporated herein by reference.

BACKGROUND OF THE INVENTION

1. Field of the Invention

The present invention relates to a recording and playback apparatus and a recording method for use in a system for performing recording and playback operations using maximum likelihood decoding. The present invention also relates to an evaluation value calculating apparatus and method used in the recording and playback apparatus.

2. Description of the Related Art

In recording and playback apparatuses for optical recording media such as optical disks, recording conditions for performing a recording operation on the recording media, such as the pulse width and level of laser emission, are adjusted to their optimum values.

In general, the factors that determine the recording conditions include zero-cross points of playback signals and statistical mean and variance values of binarized timing edge errors. However, it is difficult for signal playback systems using maximum likelihood decoding to sufficiently increase the margin.

SUMMARY OF THE INVENTION

In Japanese Patent Publication No. 3674160, a technique in which difference metrics in the maximum likelihood decoding process are used to evaluate the playback margin is proposed. Thus, a method for a maximum likelihood decoding system to evaluate the signal quality after recording has been established.

Japanese Unexamined Patent Application Publication No. 2004-335079 discloses a feedback control technique in which an evaluation value determined by using difference metrics in the maximum likelihood decoding process is used for recording conditions. In the feedback control technique disclosed in this publication, however, the evaluation value based on the difference metrics is not suitable for adjusting recording conditions in view of accurate placement of mark edges because the evaluation value is not an evaluation value whose error changes along a time axis, and is not related to edge errors of recording marks.

It is therefore desirable to provide a recording and playback system for performing a maximum likelihood decoding operation, in which a more suitable evaluation value can be obtained and recording conditions can be appropriately adjusted using the evaluation value.

According to an embodiment of the present invention, an evaluation value calculating apparatus includes the following elements. A difference metric selecting unit selects a difference metric for a specific recorded sequence in recorded sequences obtained in a maximum likelihood decoding process when information expressed with marks and spaces on a recording medium is played back, the difference metric being obtained in the maximum likelihood decoding process. A difference metric error value calculating unit determines a difference metric error value for the difference metric selected by the difference metric selecting unit using a calculation method that is selected according to an edge shift direction of each of the marks on a time axis, the difference metric error value representing an error from an ideal difference metric and the edge shift direction on the time axis. A statistical processing unit performs statistical processing on the difference metric error value determined by the difference metric error value calculating unit on the basis of each of states of path meeting points to generate an evaluation value.

The specific recorded sequence may be a recorded sequence having a path with minimum Euclidean distance in the maximum likelihood decoding process.

The evaluation value calculating apparatus may further include a mark edge determining unit that determines mark lengths and space lengths of the recorded sequences before and after edges of the marks. The statistical processing unit may perform the statistical processing on the basis of each of the states of path meeting points and further on the basis of each of the mark lengths and space lengths before and after the edges.

According to another embodiment of the present invention, a recording and playback apparatus includes the following elements. A writing/reading unit writes or reads information expressed with marks and spaces to or from a recording medium. A maximum likelihood decoding unit performs a maximum likelihood decoding process on a signal read from the recording medium by the writing/reading unit. A difference metric selecting unit selects a difference metric for a specific recorded sequence in recorded sequences obtained in the maximum likelihood decoding process performed by the maximum likelihood decoding unit, the difference metric being obtained in the maximum likelihood decoding process. A difference metric error value calculating unit determines a difference metric error value for the difference metric selected by the difference metric selecting unit using a calculation method that is selected according to an edge shift direction of each of the marks on a time axis, the difference metric error value representing an error from an ideal difference metric and the edge shift direction on the time axis. A statistical processing unit performs statistical processing on the difference metric error value determined by the difference metric error value calculating unit on the basis of each of states of path meeting points to generate an evaluation value. A recording condition calculating unit determines a recording condition using the evaluation value generated by the statistical processing unit. A recording signal generating unit generates a recording signal for allowing the writing/reading unit to perform a write operation under the recording condition determined by the recording condition calculating unit.

The specific recorded sequence may be a recorded sequence having a path with minimum Euclidean distance in the maximum likelihood decoding process.

The recording and playback apparatus may further include the following elements. A standard deviation calculating unit determines a standard deviation of the difference metric for the specific recorded sequence in the recorded sequences obtained in the maximum likelihood decoding process performed by the maximum likelihood decoding unit, and generates a second evaluation value using the determined standard deviation. A suitability determining unit determines whether or not the recording condition set in the recording signal generating unit is suitable using the second evaluation value.

Alternatively, the recording and playback apparatus may further include a suitability determining unit that determines whether or not the recording condition set in the recording signal generating unit is suitable using the evaluation value generated by the statistical processing unit.

According to another embodiment of the present invention, an evaluation value calculating method includes the steps of selecting a difference metric for a specific recorded sequence in recorded sequences obtained in a maximum likelihood decoding process when information expressed with marks and spaces on a recording medium is played back, the difference metric being obtained in the maximum likelihood decoding process; determining a difference metric error value for the selected difference metric using a calculation method that is selected according to an edge shift direction of each of the marks on a time axis, the difference metric error value representing an error from an ideal difference metric and the edge shift direction on the time axis; and performing statistical processing on the determined difference metric error value on the basis of each of states of path meeting points to generate an evaluation value.

According to another embodiment of the present invention, a recording method includes the steps of selecting a difference metric for a specific recorded sequence in recorded sequences obtained in a maximum likelihood decoding process when information expressed with marks and spaces on a recording medium is played back, the difference metric being obtained in the maximum likelihood decoding process; determining a difference metric error value for the selected difference metric using a calculation method that is selected according to an edge shift direction of each of the marks on a time axis, the difference metric error value representing an error from an ideal difference metric and the edge shift direction on the time axis; performing statistical processing on the determined difference metric error value on the basis of each of states of path meeting points to generate an evaluation value; determining a recording condition using the generated evaluation value; and performing recording on the recording medium under the determined recording condition.

According to the embodiments of the present invention, a recording condition for a recording medium that is optimum for a signal playback system using maximum likelihood decoding is determined by generating an evaluation value for obtaining an amount and direction of error from an ideal value from a detection result of detecting a playback signal using a maximum likelihood decoder.

For example, in recorded sequences that are obtained in a maximum likelihood decoding process and whose minimum run length is limited, an evaluation value is generated from a difference metric for a path having a path with minimum Euclidean distance, that is, a path having the possibility of 1-bit shift error, by determining a difference metric error value representing an error from an ideal difference metric using a calculation method that is selected according to an edge shift direction of a mark edge on a time axis. The obtained difference metric error value is subjected to statistical processing on the basis of each of states of path meeting points (and further on the basis of each of mark/space lengths before and after the edges) to obtain an evaluation value.

This means that difference metrics of a path meeting point at which one pair of paths branched from a certain state meet at the earliest time are selected and are subjected to statistical processing so that a value (difference metric error value) determined so that the sign of an error from an ideal value that is regarded as the amount of edge shift is aligned with that on the time axis can be statistically processed on the basis of each of states of path meeting points.

According to an embodiment of the present invention, a difference metric error value determined so that the sign of an error from an ideal difference metric that is regarded as the amount of edge shift is aligned with that on the time axis is determined on the basis of each of states of path meeting points to generate an evaluation value. Recording conditions under which the evaluation value is close to zero are determined, and recording is performed under the determined recording conditions, thereby obtaining a playback signal that allows an optimum standard deviation of difference metrics in the maximum likelihood decoding process. Thus, advantageously, a maximum likelihood decoding system can determine recording conditions for achieving high playback signal quality with low error rate.

Further, the method for evaluating mark edges on a recording medium can easily replace a method for evaluating zero-cross points of playback signals or statistically evaluating binarized timing edge errors. A maximum likelihood decoding system can easily achieve high playback signal quality with low error rate using an existing recording condition optimizing method.

BRIEF DESCRIPTION OF THE DRAWINGS

FIG. 4 is a diagram showing the relationship between branches, recorded bits, states, expected values, and branch metrics;

FIG. 5 is a diagram showing conditions under which the branches are selected;

FIG. 6 is a diagram showing difference metrics;

FIG. 9 is a diagram showing a recorded sequence that has a path with minimum Euclidean distance in the maximum likelihood decoding process and whose minimum run length is limited;

FIG. 11 is a block diagram showing an evaluation value calculating unit according to the embodiment;

FIGS. 12A and 12B are diagrams showing methods of classification of difference metric error values by the evaluation value calculating unit according to the embodiment;

DESCRIPTION OF THE PREFERRED EMBODIMENTS

An embodiment of the present invention will be described.

First of all, a process for determining a difference in likelihood between playback signal sequence paths corresponding to recoded sequences of a path with minimum Euclidean distance will be described. The description will be given with respect to a partial-response maximum-likelihood (PRML) method for performing partial-response recording/playback and performing maximum likelihood decoding such as Viterbi decoding. In the PRML method, a partial-response characteristic of (B/2, A, B/2) shown in FIG. 1 is selected, and a run length limited (RLL) code such as an RLL (1, 7) code is used in which the minimum run length is limited to 1.

Figures 1, 2:
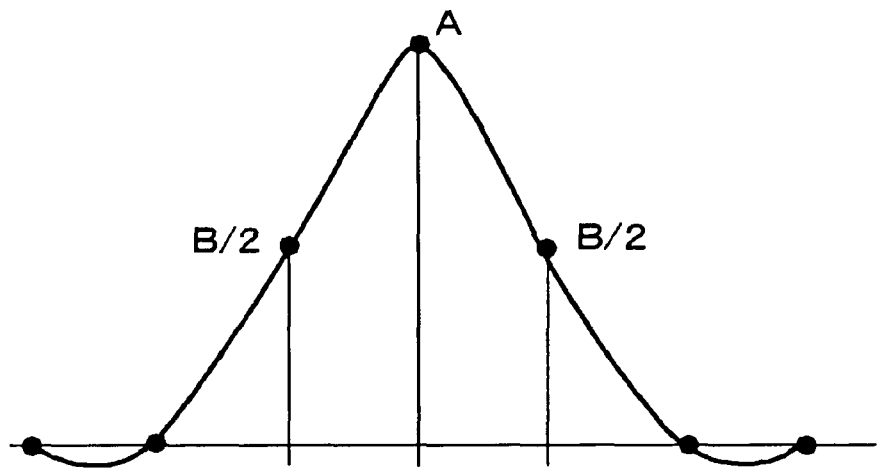
FIG. 1 is a diagram showing an example of a partial response characteristic.
FIG. 2 is a diagram showing states S0 to S3 defined by a recorded bit sequence.

A state $S_k$ that is defined by a recorded bit sequence $b_k \ni (0, 1)$ at sampling time k has transitions to four states shown in FIG. 2, namely, S0, S1, S2, and S3.

Figure 3:
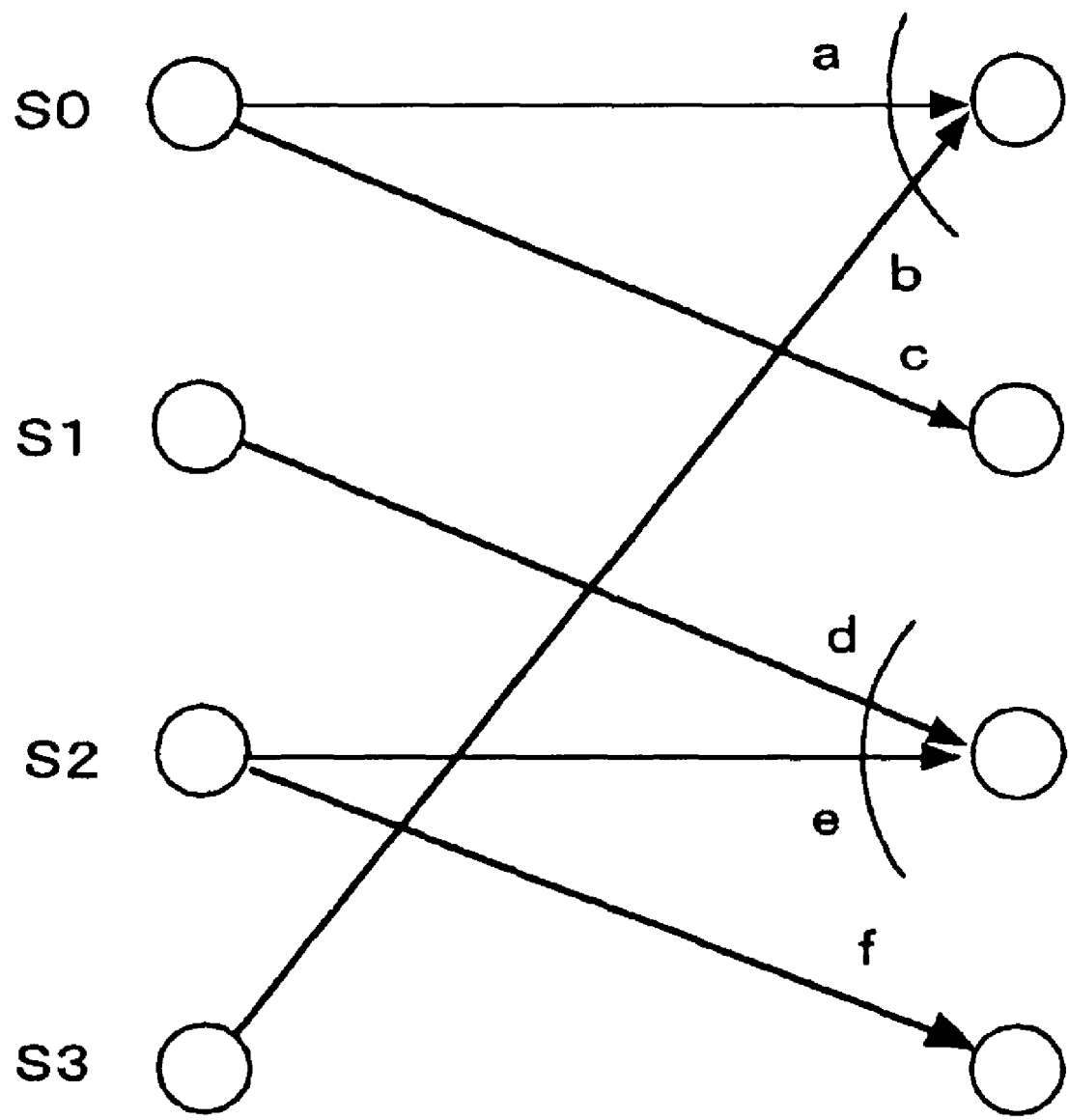
FIG. 3 is a diagram showing state transitions in the maximum likelihood decoding process.

The states S0, S1, S2, and S3 transition to next states according to the values of the next recorded bits. FIG. 3 is a trellis diagram showing the state transitions. In FIG. 3, a circle indicates a state at each time point, and an arrow indicates a state transition in accordance with a recorded bit. The state transitions indicated by the arrows are referred to as "branches," and the branches have identifiers a, b, c, d, e, and f.

FIG. 4 shows the relationship among the branches, the recorded bit sequence $b_k$, previous and subsequent states $S_{k-1}$ and $S_k$, an expected value $y_k$, and a branch metric $(z_k - y_k)^2$.

The expected value $y_k$ means an output of an ideal playback channel without noise or distortion with respect to the recorded bit sequence $b_k$, and is determined by Equation (1) as follows.

$$y_k = B/2 b'_{k-2} + A b'_{k-1} + B/2 b'_k \qquad (1)$$

where $b'_k$ denotes a value obtained by assigning the value 0 of the recorded bit sequence $b_k$ to −1 and assigning the value 1 of the recorded bit sequence $b_k$ to 1. The branch metric $(z_k - y_k)^2$ is a quantity representing a difference between an actual playback sequence $z_k$ and the expected value $y_k$ of each of the branches, and is represented by $bma_k$, $bmb_k$, etc., by adding the suffix of the branches to the branch metric.

In FIGS. 3 and 4, branches corresponding to prohibited patterns of { ... 0, 1, 0 ... } and { ... 1, 0, 1 ... } when the minimum run length is limited to 1 are omitted.

In the Viterbi decoding, the branches a and b meeting at the state S0 or the branches d and e meeting at the state S2 shown in FIG. 3 are selected at each sampling time.

In the states S1 and S3, the branches c and f are not selected and remain. As a result, a recorded sequence corresponding to a series of paths that remain without interruption is detected as an actually recorded sequence.

FIG. 5 shows conditions under which the selection is to be made.

In FIG. 5, a metric $m0_{k-1}$ is an accumulated value of branch metrics of paths that remain in the state S0 at sampling time k−1. At the sampling time k, a branch having a smaller metric is selected from the branches a and b. The value of the selected branch is represented by $m0_k$ and is used for the selection at next sampling time k+1. A similar operation is performed in the state S2. In the states S1 and S3, due to the limitation of the minimum run length, as shown in FIG. 3, the metrics in the states S0 and S2 are taken over without performing the selection.

A metric $mx_k$ that is obtained when a path corresponding to a true recorded sequence of N bits is selected without error is give by Equation (2) as follows:

$$mx_k = \sum_{K=0}^{N-1} (z_{n-k} - y_{n-k})^2 \qquad (2)$$

where $y_k$ is a true expected value sequence corresponding to the true recorded sequence. Assuming that it is an Nth order vector $\{y_k\}$, it corresponds to the square of the Euclidean distance from an actual input vector $\{z_k\}$.

The above-described selection is performed so that the metric of the remaining path becomes minimum. Therefore, the metric $mx_k$ is minimum. Thus, a path of the shortest distance from the recorded sequence vector remains. This can be understood from Equation (2) above in which the actual playback sequence $z_k$ takes value 0 if it coincides with the true expected value sequence $y_k$ corresponding to the true recorded series, and takes a non-zero positive value if even one bit does not coincide.

In the Viterbi decoding method, an error occurs when a path is not correctly selected. For example, when the state of the recorded sequence at the sampling time k is the state S0, an error occurs if the branch b (=S3→S0) is selected although the transition of the branch a (=S0→S0) is correct. That is, referring to FIG. 5, an error occurs if the following relation is established:

$$m3_{k-1} + bmb_k - (m0_{k-1} + bma_k) < 0$$

Conversely, when the state of the recorded sequence is the state S3, an error occurs if the following relation is established:

$$m0_{k-1} + bma_k - (m3_{k-1} + bmb_k) \leq 0$$

The difference is referred to as a difference metric $\Delta m_k$, and takes a negative value each time an error occurs in each transition. The difference metric $\Delta m_k$ is determined in the manner shown in FIG. 6.

The playback sequence $z_k$ is synchronized with the correct recorded sequence as a result of decoding or by a synchronization signal, and the difference metric $\Delta m_k$ is determined for each of the recorded sequences. If the tail of the distribution in the positive direction extends farther, an error is not likely to occur.

The distribution reflects variations in amplitude of the playback signal. In many recording media, the variations are caused by noise. If a normal distribution around its mean value is provided, where the mean value is represented by $\mu$ and the standard deviation is represented by $\sigma$, the probability density distribution function is expressed by Expression (3) as follows:

$$\exp\{-(x-\mu^2)/2\sigma^2\} \qquad (3)$$

The probability of taking a negative value is determined by Equation (4) as follows:

$$prob(\Delta m < 0) = \frac{1}{2\sigma} \int_0^{-\infty} \exp\{-(x - \mu^2)/2\sigma^2\} dx \quad (4)$$

Figure 7:
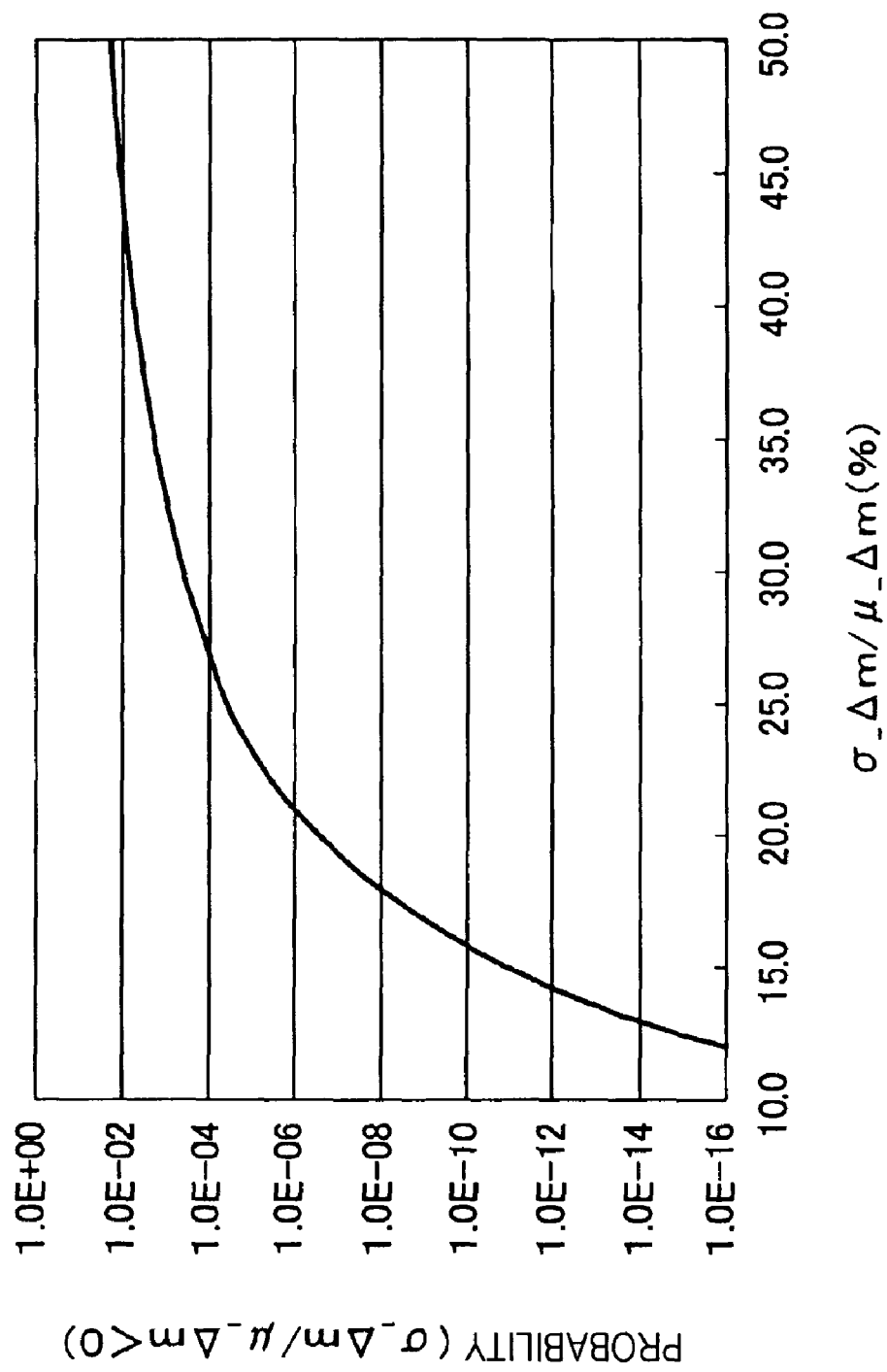
FIG. 7 is a diagram showing the relationship between a value given by dividing a standard deviation of a difference metric by a mean value of the difference metric and the probability.

FIG. 7 shows the relationship between the value obtained by dividing a standard deviation σ_Δm of a difference metric by a mean value μ_Δm of the difference metric and the probability. As can be seen from FIG. 7, if the mean value μ_Δm and the standard deviation σ_Δm of the difference metric $\Delta m_k$ are determined, the value of σ_Δm/μ_Δm is minimized to minimize the error rate.

If the difference metrics in the states S0 and S2 are used for all playback sequences, at worst, distances between paths vary depending on the pattern, resulting in an aggregate of distributions having mean values (equal to center values) of different types, which is different from the normal distribution. Thus, the correlation between the value of σ_Δm/μ_Δm and the error rate may decrease.

Therefore, a recorded sequence having a minimum distance between two paths whose difference metrics Δm have a high probability of taking negative values is selected from the recorded sequences. That is, a pair of paths that are branched from a certain state and that meet at an early time, for example, in FIGS. 8A and 8B, two pairs of paths, i.e., four paths, is selected. Specifically, a pair of paths shown in FIG. 8A, namely, a path (path A) with transitions to the states S0→S0→S1→S2 and a path (path B) with transitions to states S0→S1→S2→S2, and a pair of paths shown in FIG. 8B, namely, a path (path C) with transitions to the states S2→S2→S3→S0 and a path (path D) with transitions to the states S2→S3→S0→S0, are selected.

Figure 8A:
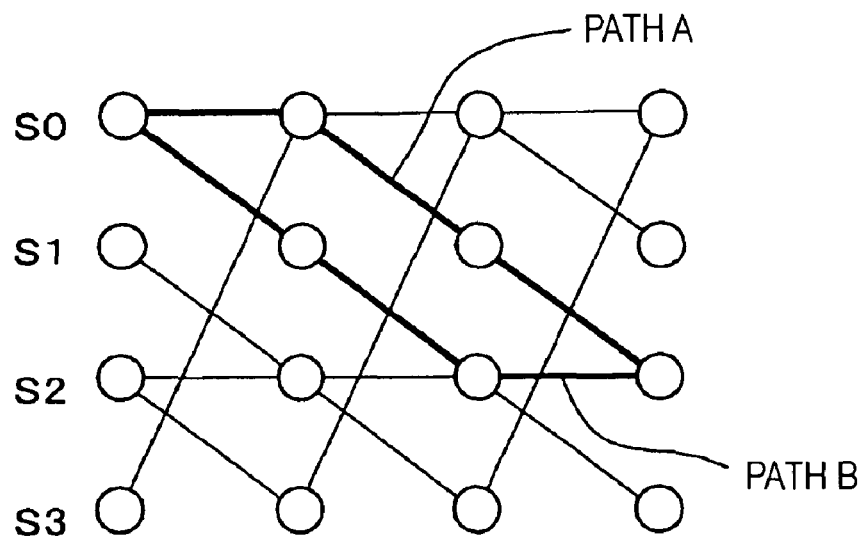
FIGS. 8A and 8B are diagrams showing a recorded sequence that has a path with minimum Euclidean distance in the maximum likelihood decoding process and whose minimum run length is limited.
Figure 8B:
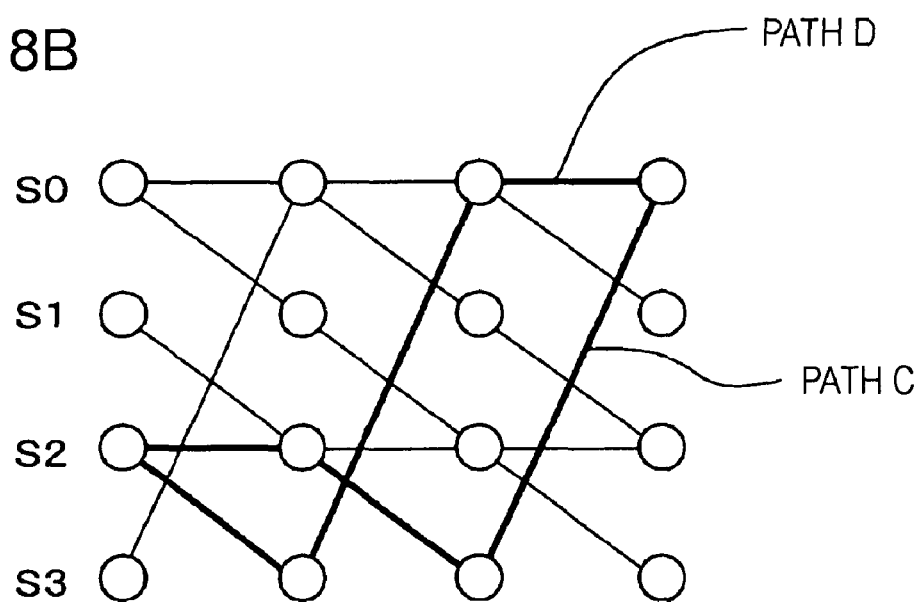

Assuming that the "1" side is the recording mark level, FIG. 8A illustrates a front mark edge and FIG. 8B illustrates a rear mark edge.

FIG. 9 shows state transitions of the paths and paths paired therewith.

In the paths shown in FIG. 9, for example, if the recording state at the sampling time k is the state S2, the recording state at the sampling time one previous to the sampling time k is the state S1, the recording state at the sampling time two previous is the state S0, and the recording state at the sampling time three previous is the state S0, the branch a shown in FIG. 3 is selected in the state S0. The difference metric Δm is calculated according to the operation shown in FIG. 6, and the mean value μ_Δm and the standard deviation σ_Δm are determined. These values are indexes for minimizing the error rate.

However, the value of σ_Δm/μ_Δm is not an evaluation value statistically obtained when the sign of an error on the time axis that is regarded as the amount of edge shift is aligned with that on the time axis.

In the embodiment, therefore, a calculation method of difference metrics of specific recorded sequences of the path A, path B, path C, and path D described above, that is, difference metrics of recorded sequences that have a path with minimum Euclidean distance in the maximum likelihood decoding process and whose minimum run length is limited, is selected according to the edge shift directions of a mark on the time axis. Then, difference metric error values representing errors from an ideal difference metric together with the edge shift directions on the time axis are determined. The difference metric error values are classified into groups based on the states of the path meeting points and statistically collected on a group-by-group basis to generate an evaluation value.

Figure 10:
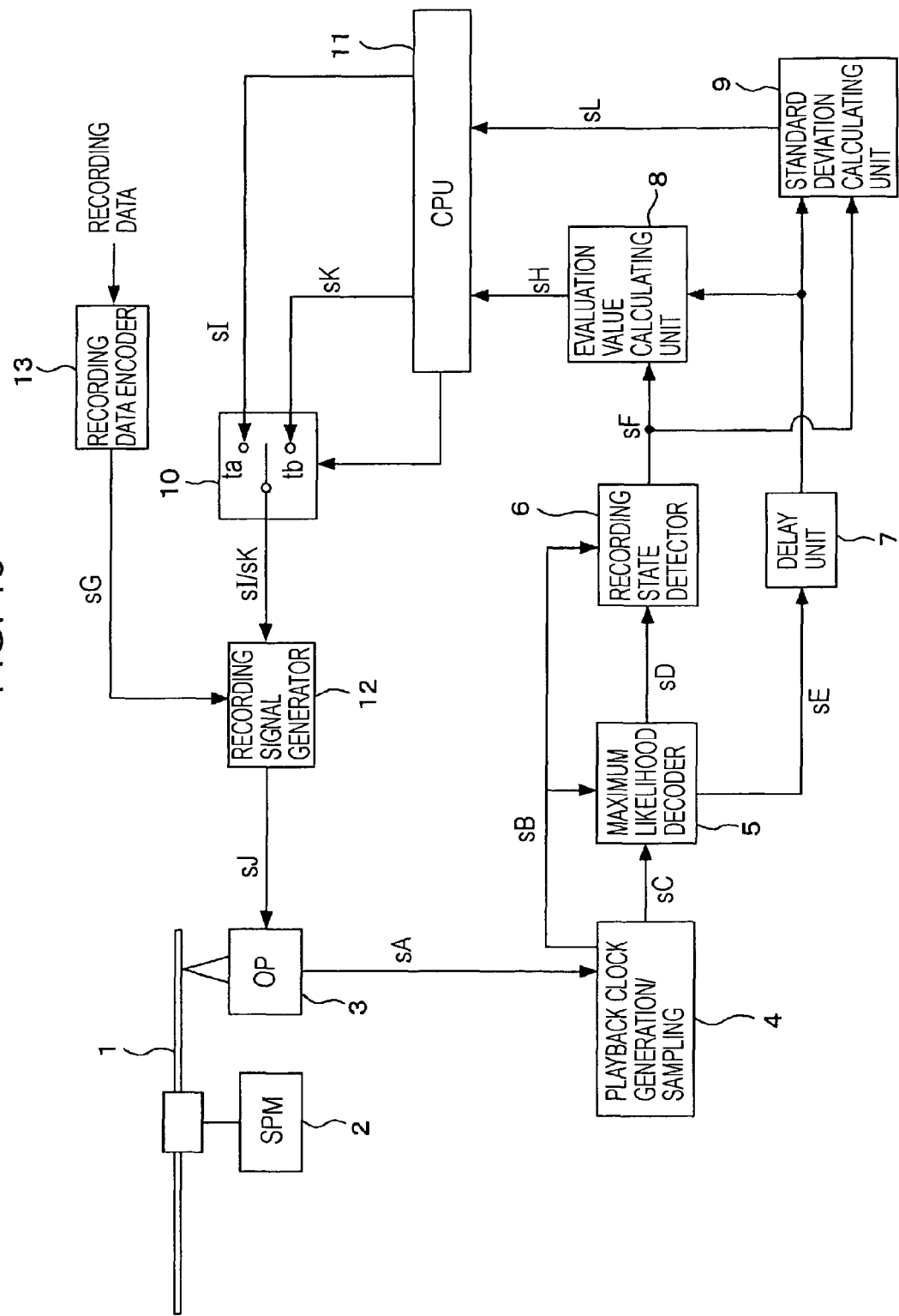
FIG. 10 is a block diagram of a main part of a recording/playback apparatus according to an embodiment of the present invention.

FIG. 10 is a block diagram of a main part of the recording and playback apparatus according to the embodiment.

An optical disk 1 serving as a recording medium on which information is recorded is rotated by a spindle motor 2 during recording/playback.

An optical head (optical pickup) 3 applies laser light output from a laser diode to the optical disk 1 through an objective lens using a predetermined optical system. The optical head 3 also directs light reflected from the optical disk 1 to a photodetector through the predetermined optical system, and obtains an electrical signal corresponding to the amount of reflected light. The optical head 3 further performs calculation on amount-of-light signals detected by a plurality of photodetectors, and generates a playback signal (playback RF signal) sA of the recorded information and various servo error signals such as tracking and focusing error signals.

In the recording process, a recording signal sJ is supplied to the optical head 3 from a recording signal generator 12. The recording signal sJ is a driving signal for the laser diode in the optical head 3, and the laser diode is driven to emit light according to the recording signal sJ.

In the recording process, recording data to be recorded on the optical disk 1 is subjected to encoding processing, such as RLL (1, 7) modulation, by a recording data encoder 13, and a resulting encoded signal sG is supplied to the recording signal generator 12. The recording signal generator 12 generates the recording signal sJ serving as a laser driving signal based on the encoded signal sG.

The level and width of pulses as the laser driving signal are determined according to recording conditions (sI or sK) supplied through a switch 10, as discussed below. That is, the recording signal generator 12 has a function for determining the intensity of laser emission and a function for determining the emission period. By adjusting the recording signal sJ serving as a laser driving signal, the recording conditions of the optical disk 1 can be adjusted.

In the playback process, the playback signal sA read by the optical head 3 is supplied to a playback clock generation/sampling circuit 4. The playback clock generation/sampling circuit 4 uses a phase-locked loop (PLL) circuit to generate a playback clock sB synchronized with the playback signal sA. The playback clock generation/sampling circuit 4 also samples the playback signal sA to generate a sampled signal sC, and output the sampled signal sC. The playback clock sB is used for the operations performed by a maximum likelihood decoder 5 and a recording state detector 6.

The sampled signal sC is supplied to the maximum likelihood decoder 5, and is subjected to processing such as partial-response equalization or Viterbi decoding. An estimated recorded sequence sD obtained by the decoding using the maximum likelihood decoder 5 is supplied to the recording state detector 6, and the recording state detector 6 generates a recording state sequence sF.

Further, in the decoding process of the maximum likelihood decoder 5, a difference metric sE is determined.

The recording state sequence sF detected by the recording state detector 6 is supplied to an evaluation value calculating unit 8 and a standard deviation calculating unit 9. The difference metric sE obtained by the maximum likelihood decoder 5 is supplied to the evaluation value calculating unit 8 and the standard deviation calculating unit 9 through a delay unit 7. The delay unit 7 is configured to provide a delay corresponding to the processing time detected by the recording state detector 6 to the difference metric sE in order to synchronize the timings of the difference metric sE and the recording state sequence sF.

The evaluation value calculating unit 8 selects a calculation method of the difference metrics sE of the specific recorded sequences of the path A, path B, path C, and path D described above, that is, recorded sequences that have a path with minimum Euclidean distance in the maximum likelihood decoding process and whose minimum run length is limited, according to the edge shift directions of the marks on the time axis, and determines difference metric error values representing errors from the ideal difference metric together with the edge shift directions on the time axis. The difference metric error values are classified into groups based on the states of the path meeting points and statistically collected on a group-by-group basis to generate an evaluation value (hereinafter also referred to as a "first evaluation value") sH. The details of the evaluation value calculating unit 8 are described below with reference to FIGS. 11 to 12B.

The standard deviation calculating unit 9 selects the difference metrics sE at points at which the two pairs of paths, i.e., four paths, namely, the paths A, B, C, and D described above, meet, and calculates a mean value and a standard deviation. Then, the standard deviation calculating unit 9 divides the standard deviation by the mean value to obtain a value of $\sigma\_\Delta m/\mu\_\Delta m$, and outputs the result as an evaluation value (hereinafter also referred to as a "second evaluation value") sL.

A central processing unit (CPU) 11 serves as a controller configured to control the overall operation of the recording and playback apparatus. In FIG. 10, the CPU 11 performs an operation for setting recording conditions.

In order to perform the operation for setting recording conditions, the CPU 11 controls switching of the switch 10, and supplies initial recording conditions sI. The initial recording conditions sI are recording conditions set in the recording signal generator 12 as default recording conditions before the adjustment of recording conditions.

The CPU 11 receives the first evaluation value sH and the second evaluation value sL from the evaluation value calculating unit 8 and the standard deviation calculating unit 9, respectively, in order to set optimum recording conditions. The CPU 11 uses the second evaluation value sL to determine whether or not the current recording conditions are suitable. The CPU 11 determines an amount of correction by which the recording conditions are corrected, and generates modified recording conditions sK based on the first evaluation value sH.

Before the adjustment of recording conditions, the CPU 11 controls the switch 10 to select a terminal ta to output the initial recording conditions sI to the recording signal generator 12. In this case, the recording signal sJ output from the recording signal generator 12 is based on the initial recording conditions sI.

When the modified recording conditions sK are generated, the CPU 11 controls the switch 10 to select a terminal tb. Then, the modified recording conditions sK are set in the recording signal generator 12. In this case, the recording signal sJ output from the recording signal generator 12 is based on the modified recording conditions sK.

In the structure shown in FIG. 10, the evaluation value calculating unit 8 generates the evaluation value sH, which is suitable for adjusting recording conditions. The evaluation value calculating unit 8 will be described in detail.

As described above, a difference in likelihood between playback signal sequence paths corresponding to the recorded sequences that have a path with minimum Euclidean distance in the maximum likelihood decoding and whose minimum run length is limited is determined. Then, statistical processing is performed on the difference in likelihood, that is, difference metrics of a path meeting point at which a pair of paths branched from a certain state meets at the earliest time, to determine the standard deviation $\sigma\_\Delta m$ and the mean value $\mu\_\Delta m$. It is understood that the error rate during playback can be evaluated using the evaluation index $\sigma\_\Delta m/\mu\_\Delta m$ obtained by dividing the standard deviation $\sigma\_\Delta m$ by the mean value $\mu\_\Delta m$. Therefore, recording conditions under which the value of $\sigma\_\Delta m/\mu\_\Delta m$ of the playback signal becomes minimum is determined, thereby obtaining a playback signal with low error rate during playback. In order to obtain such a playback signal, the amount and direction of error from the ideal playback signal are detected.

The factors used to detect the amount and direction of error are as follows.

The paths to be evaluated for the value of $\sigma\_\Delta m/\mu\_\Delta m$ are two pairs of paths shown in FIGS. 8A and 8B, i.e., the four paths (the paths A, B, C, and D). As described above, assuming that the "1" side is the recording mark level, FIG. 8A shows a front mark edge and FIG. 8B shows a rear mark edge. The difference metrics are classified into groups based the states of the path meeting points and statistical processing results of the difference metrics are collected, whereby the difference metrics can be classified depending on the mark edge.

Further, the amount of shift of the mark edges can be evaluated using errors of the difference metrics $\Delta m$ of the paths to be evaluated with respect to the ideal difference metric. However, there may be a pair of paths whose polarities of difference metrics are opposite in the mark edge shift direction as viewed on the time axis. It is therefore difficult to determine the shift directions of the mark edges only by collecting difference metrics of paths to be evaluated on the basis of the states of the path meeting points.

For example, if the front mark edge is shifted in the forward direction in time, the difference metric of the path A has a positive polarity (+) while the difference metric of the path B has a negative polarity (−).

If the rear mark edge is shifted in the forward direction in time, the difference metric of the path C has a positive polarity (+) while the difference metric of the path D has a negative polarity (−).

As a playback signal, it is important that difference metrics of a pair of paths be balanced.

Accordingly, a difference metric error value DM_MEP in which when a difference metric that coincides with that of a correct recorded sequence is set as an ideal, an error from the ideal difference metric is positive in a direction where the shift direction of a recording mark edge is positive on the time axis is defined.

The difference metric error value DM_MEP is determined by the following equations:

for the path A or C, $$DM\_MEP = \Delta m - DMopt$$

for the path B or D, $$DM\_MEP = DMopt - \Delta m$$

where DMopt denotes the ideal difference metric.

The difference metric error values DM_MEP determined in the manner described above are classified into groups based on the states of the path meeting points and are statistically collected on a group-by-group basis, whereby the error of a target edge from the ideal difference metric can be evaluated.

The difference metric error value DM_MEP of each of the paths A and B meeting at the state S2 is referred to as a front-mark-edge difference metric error value DM_MEP$_{FRONT}$, and the difference metric error value DM_MEP of each of the paths C and D meeting at the state S0 is referred to as a rear-mark-edge difference metric error value DM_MEP$_{REAR}$. The following calculations are performed:

$$\Sigma DM\_MEP_{FRONT} = \Sigma DM\_MEP(\text{Path } A) + \Sigma DM\_MEP(\text{Path } B)$$

$$\Sigma DM\_MEP_{REAR} = \Sigma DM\_MEP(\text{Path } C) + \Sigma DM\_MEP(\text{Path } D)$$

The amount of shift of the mark edges can be evaluated from the mean values of those sums.

The states previous and subsequent to the target path for which the difference metric error value DM_MEP is to be determined are stored, and the mark lengths and space lengths before and after the edges are determined to perform statistical processing and evaluation depending on the pattern of the mark length and the space length. Thus, recording conditions can be adjusted depending on the mark length and the space length. In order to replace an existing evaluation method, the same method as the existing evaluation method may be used, or the mark lengths and space lengths to be determined may be set according to the functionality of the recording signal generator 12.

The evaluation value calculating unit 8 may be a calculating unit having a function for outputting a sum of difference metric error values DM_MEP on the basis of each set of mark length and space length before and after the edge and the number of sums, or a mean value of the difference metric error values DM_MEP.

The evaluation value calculating unit 8 has a structure shown in, for example, FIG. 11.

A difference metric selector 21 selects difference metrics for a recorded sequence having a path with minimum Euclidean distance from recorded sequences that are obtained in the maximum likelihood decoding process and whose minimum run length is limited. That is, the difference metric sE is supplied from the maximum likelihood decoder 5 through the delay unit 7, and the difference metric selector 21 determines whether or not the difference metric sE is a difference metric for the target path A, B, C, or D using the recording state sequence sF supplied from the recording state detector 6, and supplies the selected difference metric to a DM_MEP calculating unit 22.

The DM_MEP calculating unit 22 selects a calculation method of the selected difference metric sE according to the edge shift direction of the mark on the time axis, and determines a difference metric error value DM_MEP representing an error from the ideal difference metric together with the edge shift direction on the time axis.

That is, it is determined which of the difference metrics sE of the paths A, B, C, and D the difference metric sE selected by the difference metric selector 21 corresponds to from the recording state sequence sF. For the path A or C, the calculation of DM_MEP=Δm−DMopt is performed to determine the difference metric error value DM_MEP. For the path B or D, the calculation of DM_MEP=DMopt−Δm is performed to determine the difference metric error value DM_MEP.

The determined difference metric error value DM_MEP is supplied to a DM_MEP statistical processor 24.

A mark edge determining unit 23 determines mark lengths and space lengths before and after mark edges from the recording state sequence sF, and supplies determination results to the DM_MEP statistical processor 24 as edge information for statistical classification.

For example, it is determined whether the mark/space length is 2T, 3T, 4T, or 5T or more (where T denotes the channel clock length). With respect to a front mark edge, it is determined whether the space length immediately before the edge is 2T, 3T, 4T, or 5T or more, and it is also determined whether the mark length immediately after the edge is 2T, 3T, 4T, or 5T or more. The determination result is output as edge information. With respect to a rear mark edge, it is determined whether the mark length immediate before the edge is 2T, 3T, 4T, or 5T or more, and it is also determined whether the space length immediately after the edge is 2T, 3T, 4T, or 5T or more. The determination result is output as edge information.

The mark edge determining unit 23 is provided for the classification based on the mark/space length in the DM_MEP statistical processor 24. If the classification based on the mark/space length is not performed in the DM_MEP statistical processor 24, the mark edge determining unit 23 may be omitted.

The DM_MEP statistical processor 24 performs statistical processing on the difference metric error value DM_MEP supplied from the DM_MEP calculating unit 22 on the basis of each of the states of the path meeting points.

That is, the supplied difference metric error value DM_MEP is subjected to statistical processing based on classification depending on a front mark edge or rear mark edge. Specifically, the calculation below is performed on the difference metric error value DM_MEP for the front mark edge, i.e., the path A or B:

$$\Sigma DM\_MEP_{FRONT} = \Sigma DM\_MEP(\text{Path } A) + \Sigma DM\_MEP(\text{Path } B)$$

The calculation below is performed on the difference metric error value DM_MEP for the front mark edge, i.e., the path C or D:

$$\Sigma DM\_MEP_{REAR} = \Sigma DM\_MEP(\text{Path } C) + \Sigma DM\_MEP(\text{Path } D)$$

The mean value of the results is used as the evaluation value sH. The calculation may further be performed based on classification depending on the mark/space length before and after the mark edges.

Two classification methods for generating the evaluation value sH are shown in FIGS. 12A and 12B.

FIG. 12A shows a method of classification based on the states of the path meeting points. Specifically, a statistical sum of front-mark-edge difference metric error values DM_MEP$_{FRONT}$ (i.e., $\Sigma DM\_MEP_{FRONT}$), which are difference metric error values DM_MEP of a front mark edge, is calculated, and the mean value of the sum is used as an evaluation value sH1.

Further, a statistical sum of difference metric error values DM_MEP of a rear mark edge (i.e., $\Sigma DM\_MEP_{REAR}$) is calculated, and the mean value of the sum is used as an evaluation value sH2.

The evaluation values sH1 and sH2 are supplied to the CPU 11 as the evaluation value sH.

FIG. 12B shows a method of classification based on the states of the path meeting points and based on the mark/space lengths before and after edges.

For example, it is assumed that the mark edge determining unit 23 determines that the mark/space length is 2T, 3T, 4T, or 5T or more. In this case, classification based on sets of mark lengths 2T, 3T, 4T, and 5T or more and space lengths 2T, 3T, 4T, and 5T or more is performed.

The front-mark-edge difference metric error values DM_MEP$_{FRONT}$, which are the difference metric error values DM_MEP of the front mark edges, are classified into 15 groups depending on the space length before the edge and the mark length after the edge.

For example, a sum of the front-mark-edge difference metric error values DM_MEP$_{FRONT}$ in the group of a space length of 2T before the edges and a mark length of 3T after the edges is calculated, and a mean value of the sum is determined to generate an evaluation value sH1-1.

A sum of the front-mark-edge difference metric error values $DM\_MEP_{FRONT}$ in the group of a space length of 2T before the edges and a mark length of 4T after the edges is calculated, and a mean value of the sum is determined to generate an evaluation value sH1-2.

Further, sums of the front-mark-edge difference metric error values $DM\_MEP_{FRONT}$ in the remaining groups of space lengths before the edges and mark lengths after the edges, as shown in FIG. 12B, are calculated, and mean values of the sums are determined to generate evaluation values sH1-3, ..., sH1-15.

The rear-mark-edge difference metric error values $DM\_MEP_{REAR}$, which are the difference metric error values DM_MEP of the rear mark edges, are also classified into 15 groups depending on the mark length before the edges and the space length after the edges.

For example, a sum of the rear-mark-edge difference metric error values $DM\_MEP_{REAR}$ in the group of a mark length of 2T before the edges and a space length of 3T after the edges is calculated, and a mean value of the sum is determined to generate an evaluation value sH2-1.

A sum of the rear-mark-edge difference metric error values $DM\_MEP_{REAR}$ in the group of a mark length of 2T before the edges and a space length of 4T after the edges is calculated, and a mean value of the sum is determined to generate an evaluation value sH2-2.

Further, sums of the rear-mark-edge difference metric error values $DM\_MEP_{REAR}$ in the remaining groups of mark lengths before the edges and space lengths after the edges, which are not shown in FIG. 12B, are calculated, and mean values of the sums are determined to generate evaluation values sH2-3, ..., sH2-15.

Accordingly, sums of the difference metric error values DM_MEP are calculated for a total of 30 groups, and 30 evaluation values sH1-1 to sH1-15 and sH2-1 to sH2-15 obtained as the mean values of the sums are supplied to the CPU 11 as the evaluation value sH.

Although there are 16 possible sets of mark lengths and space lengths, i.e., four mark/space lengths 2T, 3T, 4T, and 5T or more, the set of a mark length of 2T and a space length of 2T is excluded, resulting in 15 sets. This is because a state transition with a continuous 2T-2T pattern may not satisfy the condition that branched paths meet at the earliest time although the details are omitted herein.

The DM_MEP statistical processor 24 performs statistical processing based on the classification shown in FIG. 12A or 12B, and generates the evaluation value sH.

The evaluation value sH is supplied to the CPU 11. Since the evaluation value sH is an evaluation value indicating the amount and direction of error from the ideal playback signal, the CPU 11 uses the evaluation value sH to modify the recording conditions so that the error can be eliminated.

Figure 13:
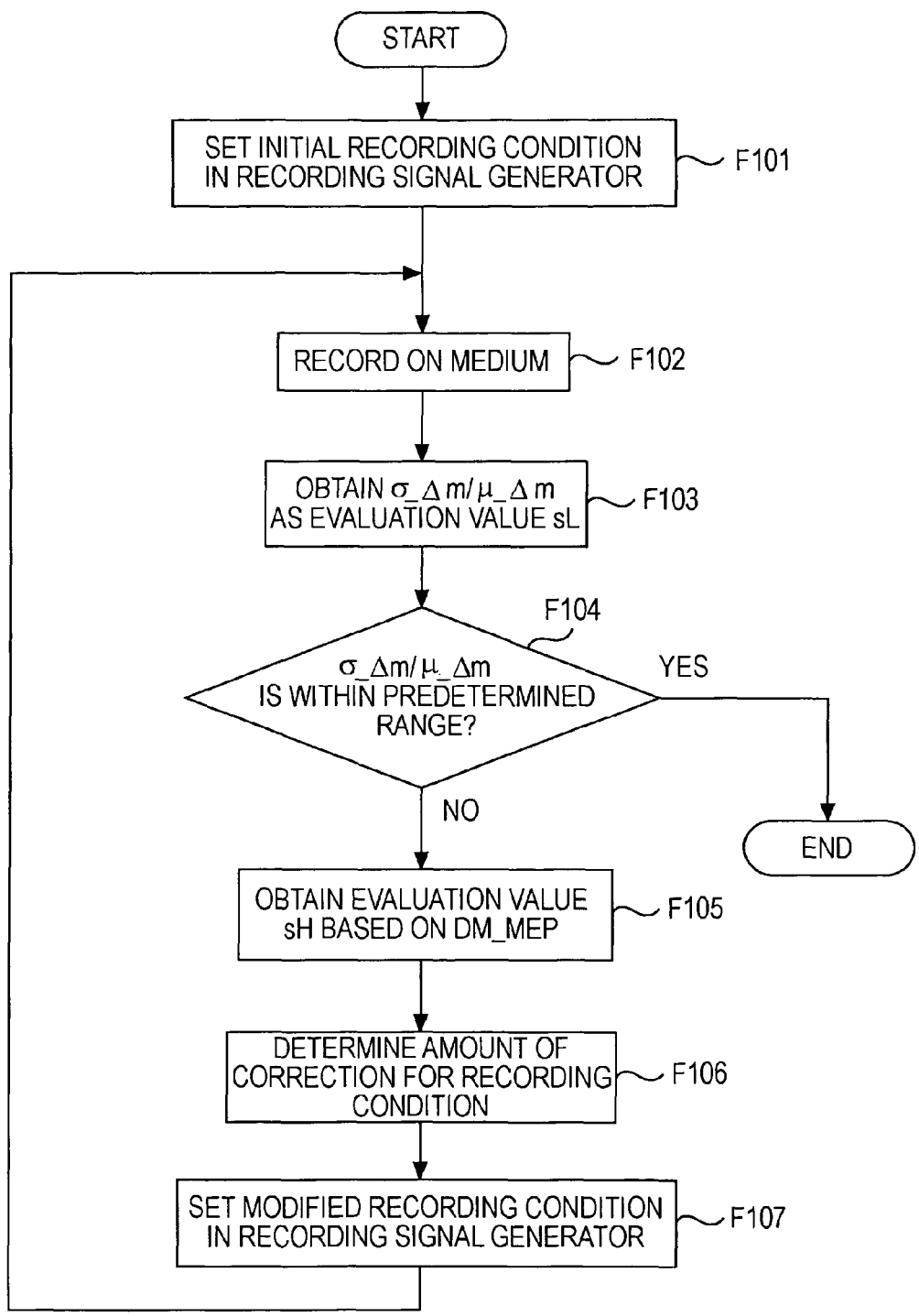
FIG. 13 is a flowchart showing a process for adjusting recording conditions according to the embodiment.

FIG. 13 is a flowchart showing an operation of the CPU 11 for adjusting recording conditions in the recording and playback apparatus shown in FIG. 10.

In step F101, the CPU 11 supplies the initial recording conditions sI to the recording signal generator 12 through the switch 10, and sets them as recording conditions to be executed.

In step F102, the CPU 11 records information on the optical disk 1 under the recording conditions. For example, a test pattern for adjusting recording conditions is generated as recording data, and is supplied to the recording signal generator 12 as the recording data sG. The recording signal generator 12 generates a laser driving signal based on the recording data sG as a test pattern. The level and width of pulses as the laser driving signal are based on the initial recording conditions sI.

After the recording of the test pattern, the recorded test pattern is played back, and the processing of step F103 is performed.

In the playback of the test pattern, the playback clock generation/sampling circuit 4, the maximum likelihood decoder 5, the recording state detector 6, the delay unit 7, the evaluation value calculating unit 8, and the standard deviation calculating unit 9 shown in FIG. 10 perform the above-described operation. In step F103, the CPU 11 obtains the evaluation value sL ($=\sigma\_\Delta m/\mu\_\Delta m$) determined by the standard deviation calculating unit 9 when the test pattern is played back.

The value of $\sigma\_\Delta m/\mu\_\Delta m$ is an index for determining whether or not the recording conditions are suitable. In step F104, it is determined the suitability of the current recording conditions from the value of $\sigma\_\Delta m/\mu\_\Delta m$. If the value of $\sigma\_\Delta m/\mu\_\Delta m$ obtained as the evaluation value sL is within a predetermined range, it is determined that the current recording conditions are suitable, and the process ends. It can be determined that the initial recording conditions sI are suitable for recording and playback. In this case, the initial recording conditions sI are determined to be optimum, and the process ends.

If the value of $\sigma\_\Delta m/\mu\_\Delta m$ is not within the predetermined range and it is determined that the recording conditions are to be optimized, then, in step F105, the CPU 11 obtains the evaluation value sH determined by the evaluation value calculating unit 8 in the manner described above.

In step F106, the CPU 11 uses the evaluation value sH to determine the amount and direction of error from the ideal playback signal, and determines the amount of correction for the recording conditions so that the error can be eliminated. In step F107, the modified recording conditions sK that reflect the amount of correction are output to and are set in the recording signal generator 12.

After the recording conditions of the recording signal generator 12 are modified in this way, the process returns to step F102, and the recording operation on the optical disk 1 is performed. In steps F103 and F104, it is determined whether or not the recording conditions are suitable using the value of $\sigma\_\Delta m/\mu\_\Delta m$. If the recording conditions are suitable, the process ends.

In the process shown in FIG. 13, therefore, unless the recording conditions are suitable, the CPU 11 generates modified recording conditions based on the evaluation value sH determined from the difference metric error values DM_MEP, and modifies the recording conditions to be set in the recording signal generator 12. The process is performed until it is determined that the recording conditions are suitable using the value of $\sigma\_\Delta m/\mu\_\Delta m$, whereby the recording conditions can be optimized.

As described above, in the embodiment, the difference metric error values DM_MEP obtained by aligning the sign of an error from the ideal difference metric that is regarded as the amount of edge shift with that on the time axis are classified into groups based on the states of the path meeting points and are statistically collected on a group-by-group basis to generate the evaluation value sH. Recording conditions under which the error represented by the evaluation value sH is close to zero are determined. If the recording conditions are not suitable, the recording conditions are modified so that the error becomes zero to obtain a playback signal for which the value of $\sigma\_\Delta m/\mu\_\Delta m$ is minimum (within a predetermined range). Thus, the maximum likelihood decoding system can obtain recording conditions for achieving high playback signal quality with low error rate.

The method for evaluating mark edges can easily replace a method for statistically evaluating zero-cross points of playback signals or binarized timing edge errors, and the maximum likelihood decoding system can easily achieve high playback single quality with low error rate using an existing recording condition optimizing method. Since the polarity of the difference metric error values DM_MEP coincides with that on the time axis, the maximum likelihood decoding system can evaluate the playback signal quality, and the difference metric error values DM_MEP can replace edge errors output from a time interval analyzer (TIA). It is therefore easy to replace existing TIA-based timing edge error detection or zero-cross edge error detection.

In the embodiment, the paths A and B or the paths C and D can be evaluated at the same time. The evaluation value sH is an evaluation value that can be used to determine well-balanced recording conditions, and is therefore suitable as an evaluation value for setting recording conditions.

Other embodiments that can attain similar advantages will be described. In FIGS. 14 to 17 and 19, the same components as those described above are assigned the same reference numerals, and a description thereof is omitted.

Figure 14:
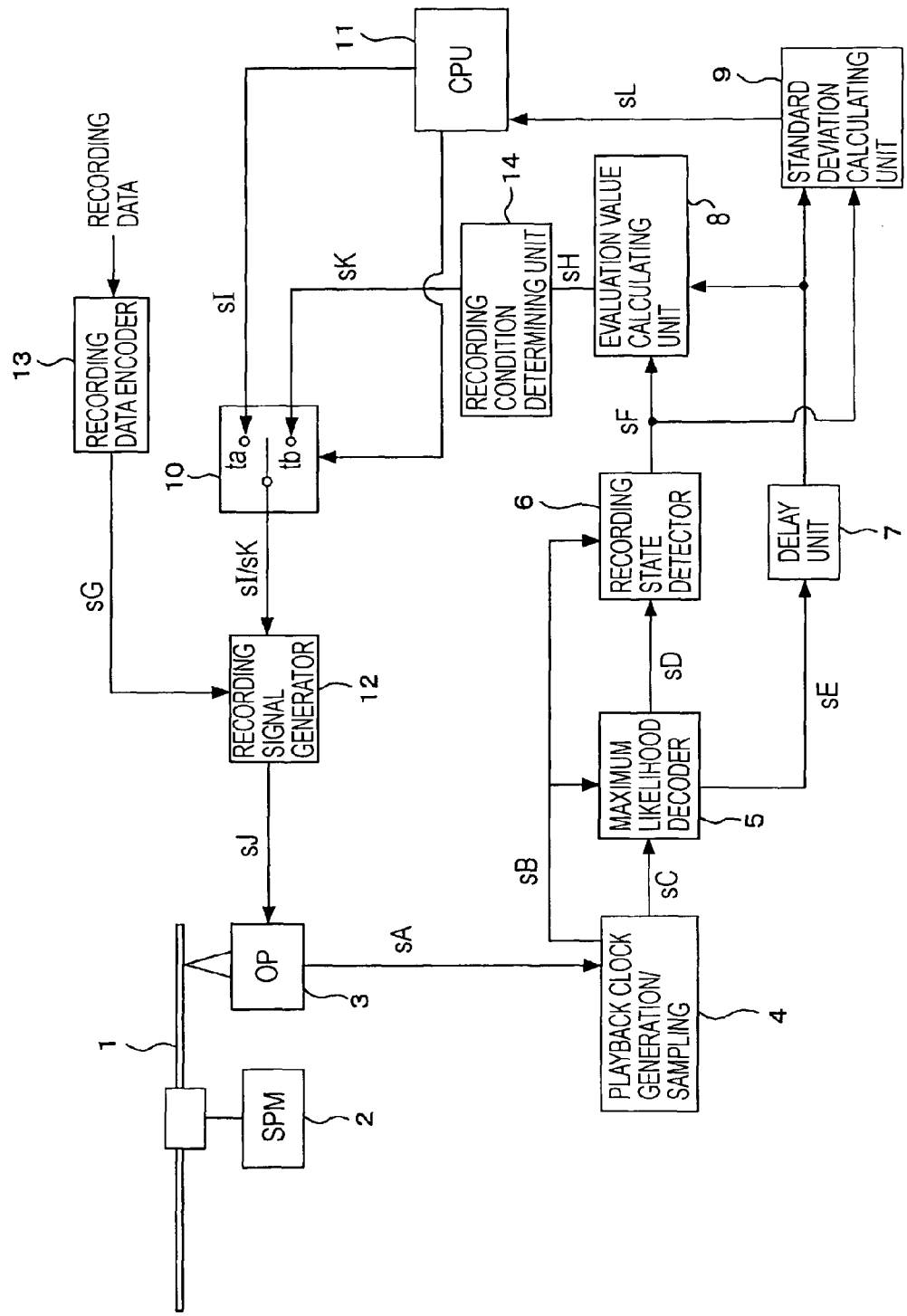
FIG. 14 is a block diagram of a main part of a recording/playback apparatus according to another embodiment of the present invention.

FIG. 14 shows a structure of a recording and playback apparatus according to another embodiment of the present invention, in which a recording condition determining unit 14 is further provided in addition to the components shown in FIG. 10.

The evaluation value sH obtained by the evaluation value calculating unit 8 is supplied to the recording condition determining unit 14, and the recording condition determining unit 14 generates the modified recording conditions sK based on the evaluation value sH.

In this embodiment, the CPU 11 is configured to set the initial recording conditions sI, to control the switch 10, and to determine the suitability of the recording conditions using the evaluation value sL. That is, the modified recording conditions sK are generated not by the CPU 11 but by the recording condition determining unit 14.

The process for adjusting recording conditions is similar as a whole to that shown in FIG. 13. It is to be noted that the processing of steps F105 and F106 is performed by the recording condition determining unit 14. In step F107, the CPU 11 connects the switch 10 to the terminal tb to supply the modified recording conditions sK generated by the recording condition determining unit 14 to the recording signal generator 12.

Figure 15:
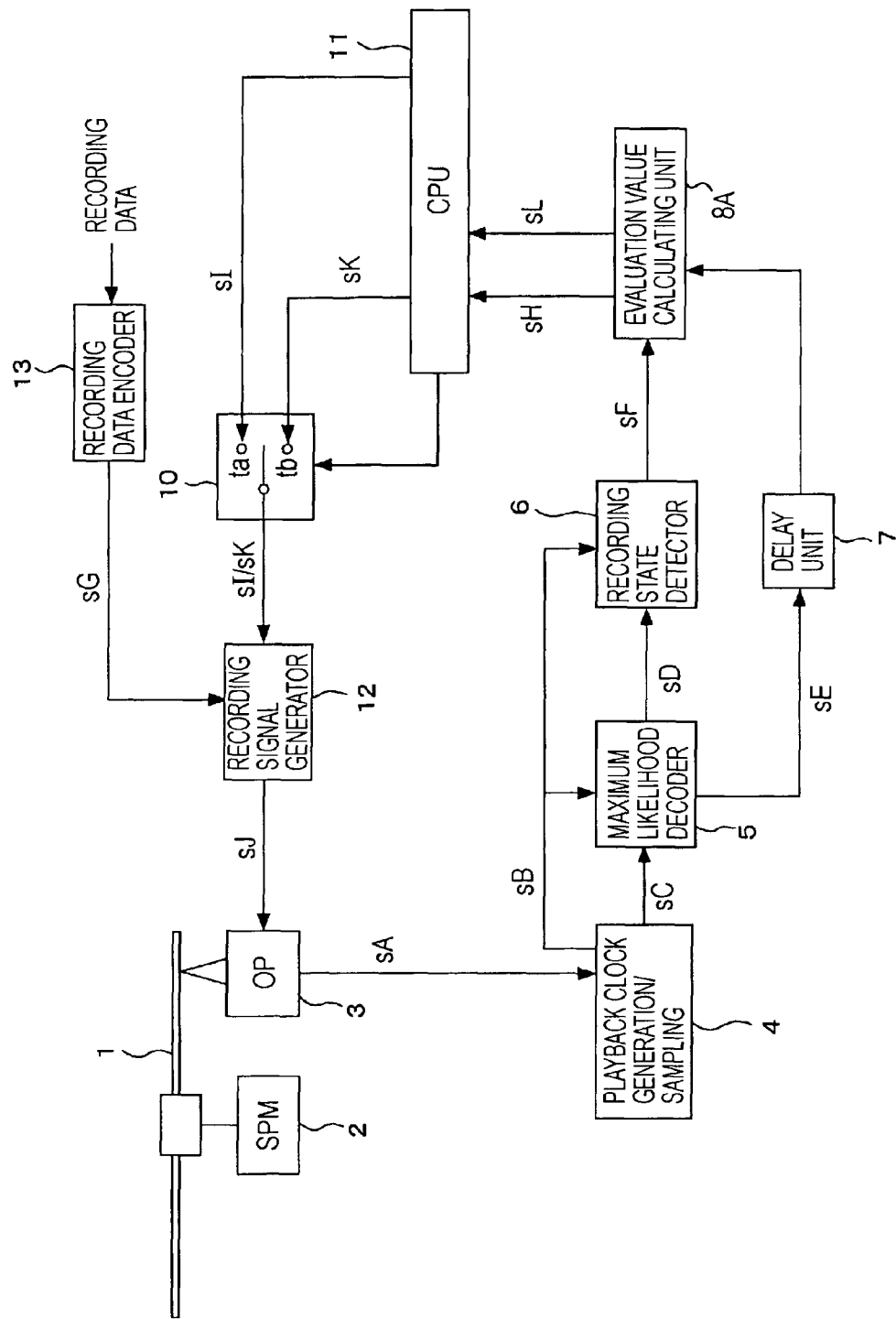
FIG. 15 is a block diagram of a main part of a recording/playback apparatus according to another embodiment of the present invention.
Figure 16:
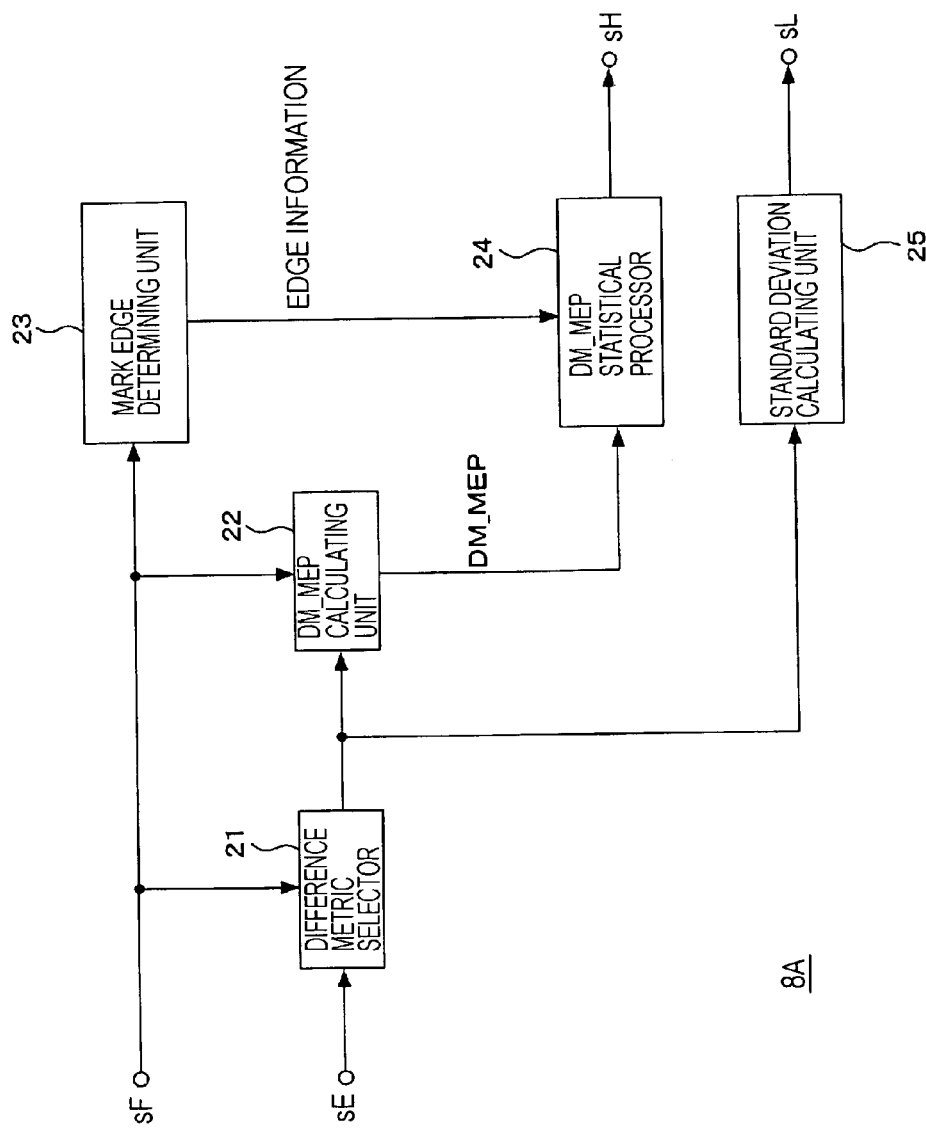
FIG. 16 is a block diagram showing an example structure of an evaluation value calculating unit according to the embodiment.

FIG. 15 shows a structure of a recording and playback apparatus according to another embodiment of the present invention in which both the evaluation values sH and sL are generated by an evaluation value calculating unit 8A. The evaluation value calculating unit 8A includes the function of the standard deviation calculating unit 9 shown in FIG. 10, and has a structure shown in, for example, FIG. 16. That is, the evaluation value calculating unit 8A further includes a standard deviation calculating unit 25 in addition to the components of the evaluation value calculating unit 8 shown in FIG. 11.

The standard deviation calculating unit 25 calculates a mean value and a standard deviation for the difference metrics sE selected by the difference metric selector 21, that is, the difference metrics of the points at which two pairs of paths, i.e., four paths, namely, the paths A, B, C, and D, meet. The standard deviation calculating unit 25 divides the standard deviation by the mean value to determine the value of $\sigma\_\Delta m / \mu\_\Delta m$, and outputs the result as the evaluation value sL.

The function and operation of the CPU 11 are similar to those of the CPU 11 shown in FIG. 10, and the process for adjusting recording conditions is similar to that shown in FIG. 13.

Figure 17:
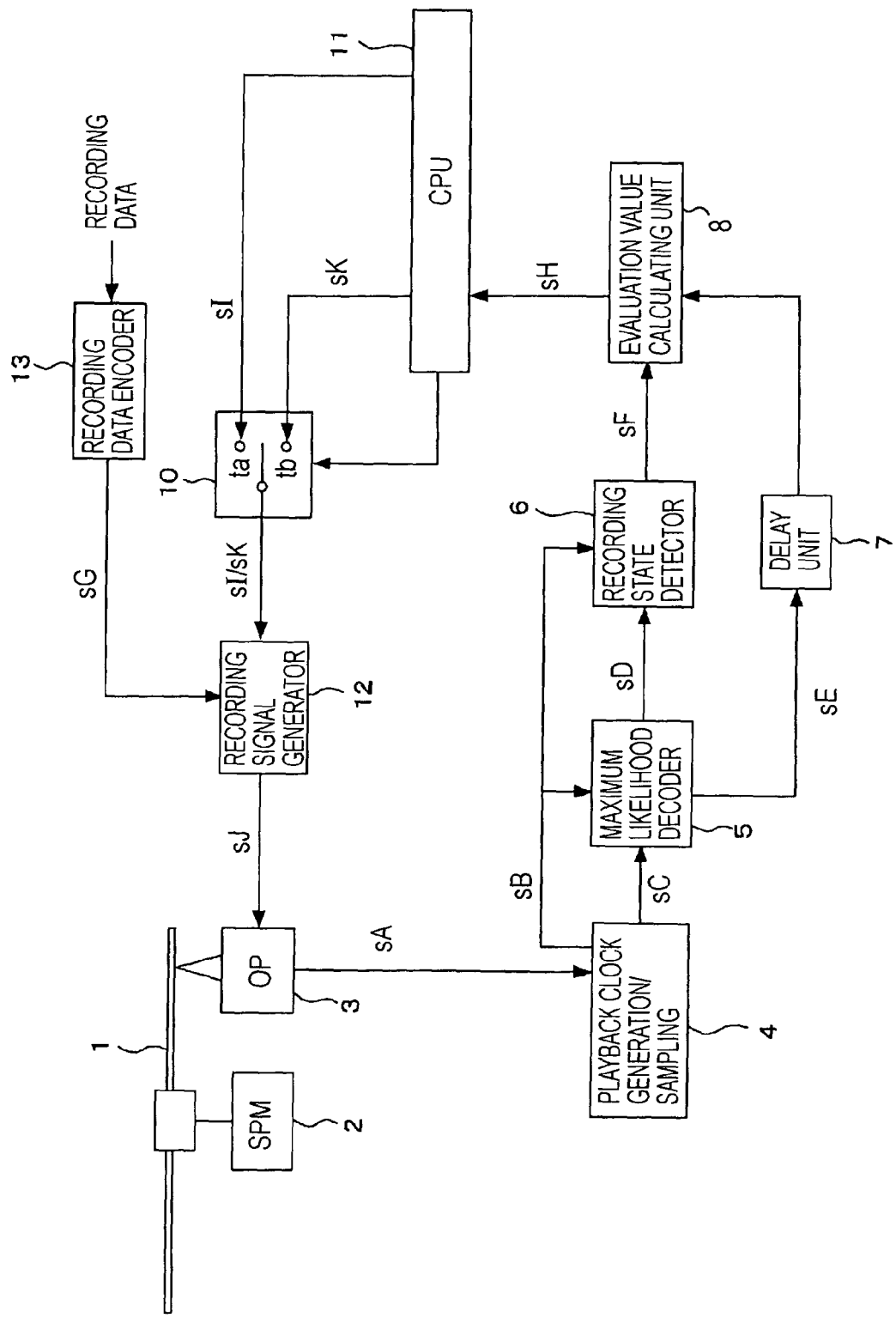
FIG. 17 is a block diagram of a main part of a recording/playback apparatus according to another embodiment of the present invention.

FIG. 17 shows a structure of a recording and playback apparatus according to another embodiment of the present invention in which the evaluation value sL ($=\sigma\_\Delta m / \mu\_\Delta m$) is not used. In this embodiment, therefore, the standard deviation calculating unit 9 is removed from the components shown in FIG. 10.

The evaluation value sH is supplied to the CPU 11 from the evaluation value calculating unit 8. The CPU 11 uses the evaluation value sH to determine whether or not the recording conditions are suitable, and generates modified recording conditions sK if the recording conditions are not suitable.

Figure 18:
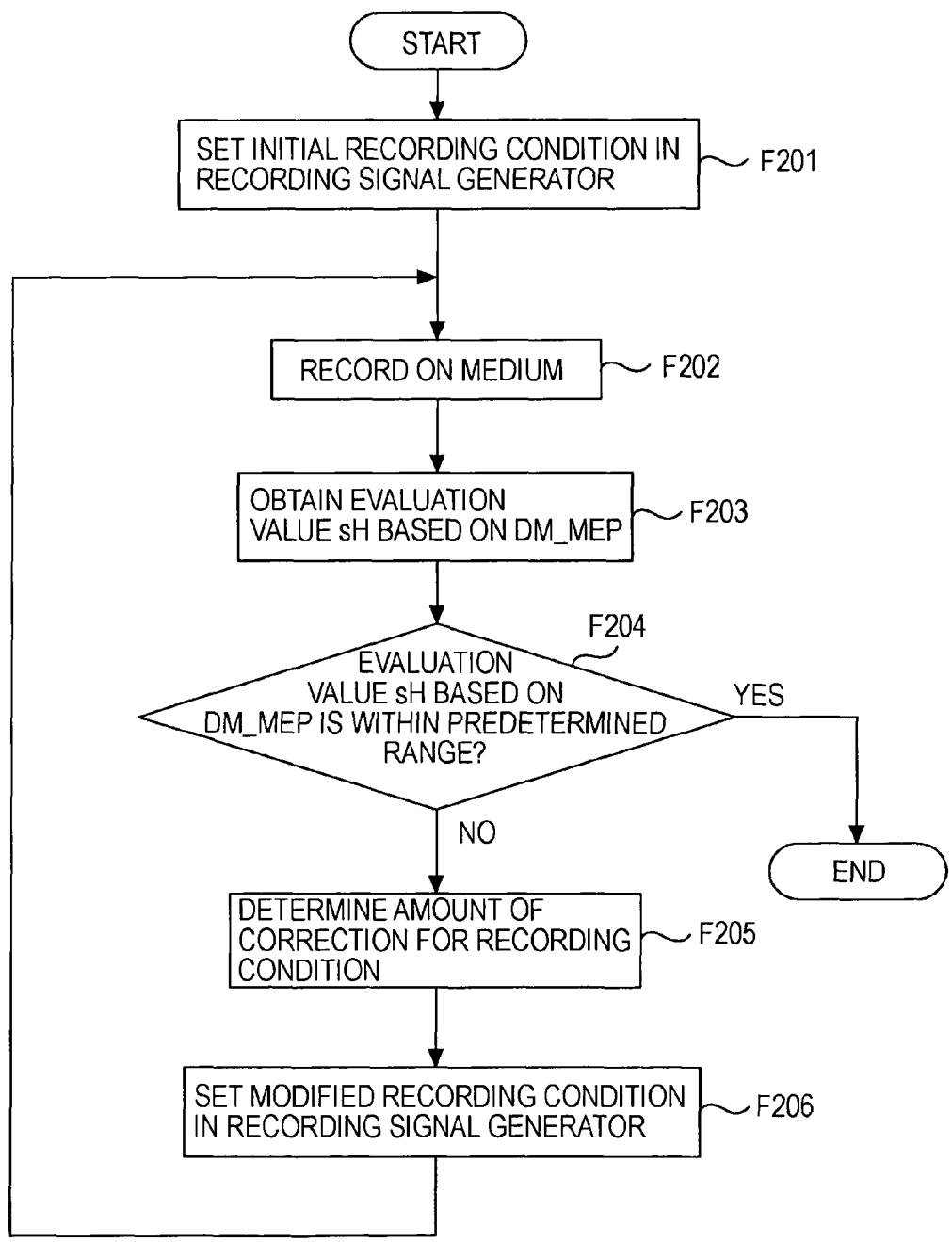
FIG. 18 is a flowchart showing a process for adjusting recording conditions according to the embodiment.

FIG. 18 is a flowchart showing an operation of the CPU 11 for adjusting recording conditions.

The processing of steps F201 and F202 shown in FIG. 18 is similar to the processing of steps F101 and F102 shown in FIG. 13, and a test pattern is recorded in a state where the initial recording conditions sI are set in the recording signal generator 12. In step F203, in order to play back the recorded test pattern, the CPU 11 acquires the evaluation value sH obtained by the evaluation value calculating unit 8. In step F204, the CPU 11 determines whether or not the evaluation value sH, that is, the evaluation value obtained by classifying and collecting the difference metric error values DM_MEP, is within a predetermined range to determine whether or not the current recording conditions are suitable.

If the evaluation value sH is within the predetermined range in step F204, the adjustment process ends. If the evaluation value sH is not within the predetermined range and it is determined that the recording conditions are not suitable, then, in step F205, the CPU 11 uses the evaluation value sH to determine the amount of correction for the recording conditions. In step F206, the modified recording conditions sK are set in the recording signal generator 12. Then, the process returns to step F202, and the subsequent processing is repeatedly performed.

As described above, the evaluation value sH obtained by classifying and collecting the difference metric error values DM_MEP indicates the amount of error, and is used to modify the recording conditions so that the error becomes zero. The evaluation value sH can therefore be used to determine whether or not the recording conditions are suitable.

Since no standard deviation calculating unit is used, this embodiment can attain the advantage of allowing for a simplification of the structure.

Figure 19:
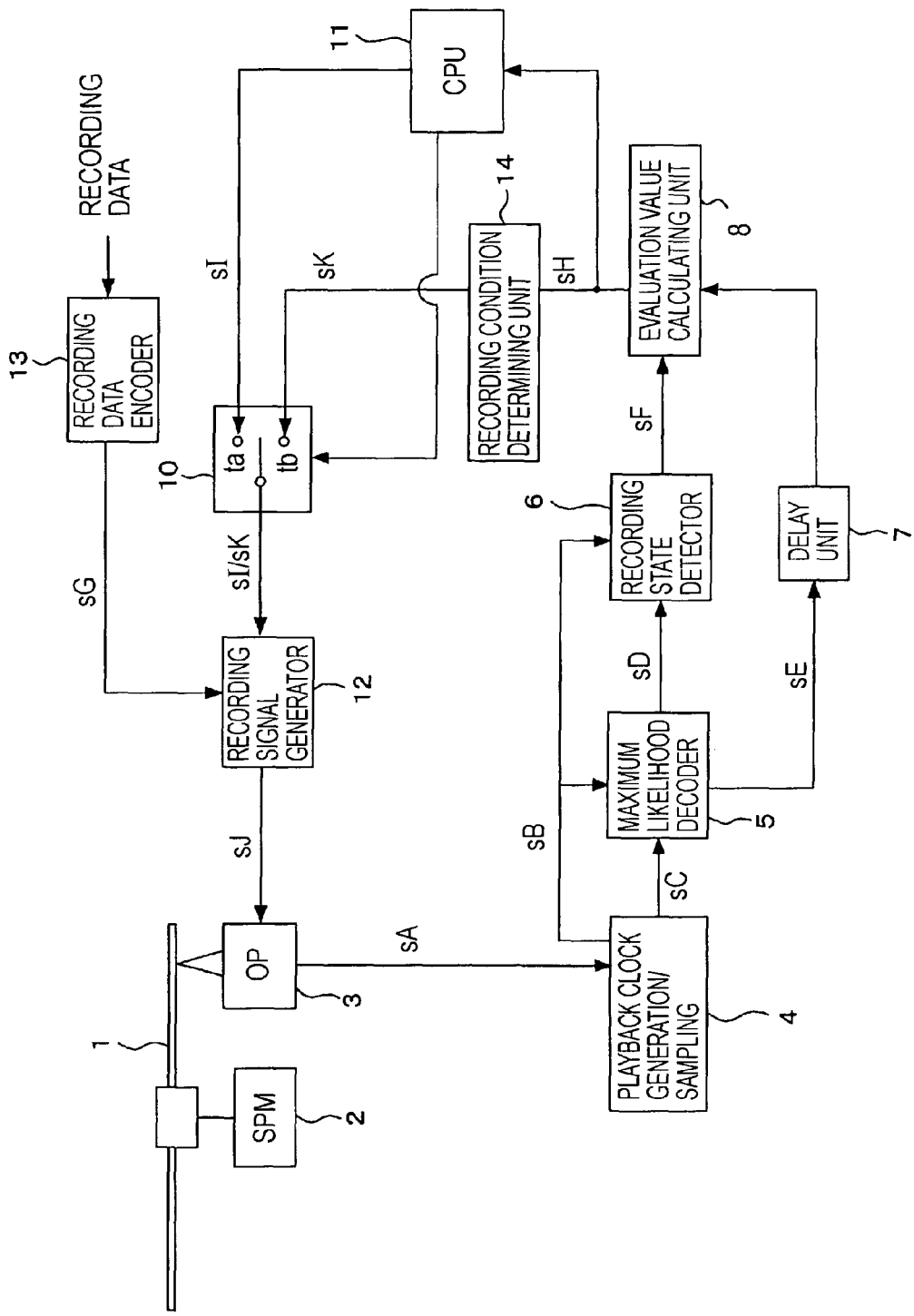
FIG. 19 is a block diagram a main part of a recording/playback apparatus according to another embodiment of the present invention.

FIG. 19 shows a structure of a recording and playback apparatus according to another embodiment of the present invention in which the evaluation value sH is used to determine whether or not the recording conditions are suitable. In this embodiment, the standard deviation calculating unit 9 is removed from the components shown in FIG. 14.

The evaluation value sH is supplied from the evaluation value calculating unit 8 to the recording condition determining unit 14 and the CPU 11.

The CPU 11 is configured to set the initial recording conditions sI, to control the switch 10, and to determine whether or not the recording conditions are suitable using the evaluation value sH. The modified recording conditions sK are generated not by the CPU 11 but by the recording condition determining unit 14.

The process for adjusting recording conditions is similar as a whole to that shown in FIG. 18. It is to be noted that the processing of step F205 is performed by the recording condition determining unit 14. In step F206, the CPU 11 connects the switch 10 to the terminal tb to supply the modified recording conditions sK generated by the recording condition determining unit 14 to the recording signal generator 12.

Although various embodiments have been described, further embodiments of the present invention can be conceivable.

In the foregoing description, the evaluation value calculating unit 8 (or 8A) may perform statistical processing on a target path based on classification into groups depending on the mark length and space length before and after an edge. The detection of the states previous and subsequent to the target path may be further extended so that classification based on the mark length and space length before the edge two edges previous and subsequent.

While the above embodiments have been described in the context of the PR (1, 2, 1) system, other partial-response equalization systems, such as PR (1, 2, 2, 1), may be employed.

The evaluation value calculating unit 8 configured to generate the evaluation value sH may be incorporated in the recording and playback apparatus, or may be provided as an external device to the recording and playback apparatus.

A recording and playback apparatus, an evaluation value calculating apparatus, a recording method, and an evaluation value calculating method used in systems for recording media other than an optical disk may fall within the scope of the present invention.

It should be understood by those skilled in the art that various modifications, combinations, sub-combinations and alterations may occur depending on design requirements and other factors insofar as they are within the scope of the appended claims or the equivalents thereof.

What is claimed is:

1. An evaluation value calculating apparatus comprising:
a difference metric selecting unit that selects a difference metric for a specific recorded sequence in recorded sequences obtained in a maximum likelihood decoding process when information expressed with marks and spaces on a recording medium is played back, the difference metric being obtained in the maximum likelihood decoding process;
a difference metric error value calculating unit that determines a difference metric error value for the difference metric selected by the difference metric selecting unit using a calculation method that is selected according to an edge shift direction of each of the marks on a time axis, the difference metric error value representing an error from an ideal difference metric and the edge shift direction on the time axis; and
a statistical processing unit that performs statistical processing on the difference metric error value determined by the difference metric error value calculating unit on the basis of each of states of path meeting points to generate an evaluation value,
wherein each of a plurality of difference metric error values are classified into groups based on the states of the path meeting points and statistically collected on a group-by-group basis to generate the evaluation value.

2. The evaluation value calculating apparatus according to claim 1, wherein the specific recorded sequence is a recorded sequence having a path with minimum Euclidean distance in the maximum likelihood decoding process.

3. The evaluation value calculating apparatus according to claim 1, further comprising a mark edge determining unit that determines mark lengths and space lengths of the recorded sequences before and after edges of the marks,
wherein the statistical processing unit performs the statistical processing on the basis of each of the states of path meeting points and further on the basis of each of the mark lengths and space lengths before and after the edges.

4. A recording and playback apparatus comprising:
a writing/reading unit that writes or reads information expressed with marks and spaces to or from a recording medium;
a maximum likelihood decoding unit that performs a maximum likelihood decoding process on a signal read from the recording medium by the writing/reading unit;
a difference metric selecting unit that selects a difference metric for a specific recorded sequence in recorded sequences obtained in the maximum likelihood decoding process performed by the maximum likelihood decoding unit, the difference metric being obtained in the maximum likelihood decoding process, a value of the difference metric changing between a negative value and a non-negative value depending on whether an error occurs during a transition;
a difference metric error value calculating unit that determines a difference metric error value for the difference metric selected by the difference metric selecting unit using a calculation method that is selected according to an edge shift direction of each of the marks on a time axis;
a statistical processing unit that performs statistical processing on the difference metric error value determined by the difference metric error value calculating unit on the basis of each of states of path meeting points to generate an evaluation,
wherein each of a plurality of difference metric error values are classified into groups based on the states of the path meeting points and statistically collected on a group-by-group basis to generate the evaluation value;
a recording condition calculating unit that determines a recording condition using the evaluation value generated by the statistical processing unit; and
a recording signal generating unit that generates a recording signal for allowing the writing/reading unit to perform a write operation under the recording condition determined by the recording condition calculating unit.

5. The recording and playback apparatus according to claim 4, wherein the specific recorded sequence is a recorded sequence having a path with minimum Euclidean distance in the maximum likelihood decoding process.

6. The recording and playback apparatus according to claim 4, further comprising:
a standard deviation calculating unit that determines a standard deviation of the difference metric for the specific recorded sequence in the recorded sequences obtained in the maximum likelihood decoding process performed by the maximum likelihood decoding unit, and that generates a second evaluation value using the determined standard deviation; and
a suitability determining unit that determines whether or not the recording condition set in the recording signal generating unit is suitable using the second evaluation value.

7. The recording and playback apparatus according to claim 4, further comprising a suitability determining unit that determines whether or not the recording condition set in the recording signal generating unit is suitable using the evaluation value generated by the statistical processing unit.

8. An evaluation value calculating method comprising the steps of:

selecting a difference metric for a specific recorded sequence in recorded sequences obtained in a maximum likelihood decoding process when information expressed with marks and spaces on a recording medium is played back, the difference metric being obtained in the maximum likelihood decoding process;

determining a difference metric error value for the selected difference metric using a calculation method that is selected according to an edge shift direction of each of the marks on a time axis, the difference metric error value representing an error from an ideal difference metric and the edge shift direction on the time axis; and performing statistical processing on the determined difference metric error value on the basis of each of states of path meeting points to generate an evaluation value, wherein each of a plurality of difference metric error values are classified into groups based on the states of the path meeting points and statistically collected on a group-by-group basis to generate the evaluation value.

9. A recording method comprising the steps of:

selecting a difference metric for a specific recorded sequence in recorded sequences obtained in a maximum likelihood decoding process when information expressed with marks and spaces on a recording medium is played back, the difference metric being obtained in the maximum likelihood decoding process;

determining a difference metric error value for the selected difference metric using a calculation method that is selected according to an edge shift direction of each of the marks on a time axis, the difference metric error value representing an error from an ideal difference metric and the edge shift direction on the time axis;

performing statistical processing on determined difference metric error value on the basis of each of states of path meeting points to generate an evaluation value;

determining a recording condition using the generated evaluation value; and performing recording on the recording medium under the determined recording condition, wherein each of a plurality of difference metric error values are classified into groups based on the states of the path meeting points and statistically collected on a group-by-group basis to generate the evaluation value.

* * * * *